(12) United States Patent
Boydston et al.

(10) Patent No.: US 6,190,453 B1
(45) Date of Patent: Feb. 20, 2001

(54) GROWTH OF EPITAXIAL SEMICONDUCTOR MATERIAL WITH IMPROVED CRYSTALLOGRAPHIC PROPERTIES

(75) Inventors: Mark R. Boydston, Vancouver, WA (US); Gerald R. Dietze, Portland, OR (US); Oleg V. Kononchuk, Vancouver, WA (US)

(73) Assignee: SEH America, Inc., Vancouver, WA (US)

( * ) Notice: Under 35 U.S.C. 154(b), the term of this patent shall be extended for 0 days.

(21) Appl. No.: 09/353,195

(22) Filed: Jul. 14, 1999

(51) Int. Cl.$^7$ .................................................. C30B 25/16
(52) U.S. Cl. ................................ 117/89; 117/93; 117/135
(58) Field of Search ................................. 117/3, 89, 93, 117/935

(56) References Cited

U.S. PATENT DOCUMENTS

| | | | |
|---|---|---|---|
| 3,941,647 | 3/1976 | Druminski | 117/90 |
| 3,945,864 | 3/1976 | Goldsmith et al. | 117/97 |
| 4,859,626 | 8/1989 | Wise | 438/505 |
| 5,110,757 | 5/1992 | Arst et al. | 438/489 |
| 5,227,330 | 7/1993 | Agnello et al. | 438/495 |
| 5,360,509 | 11/1994 | Zakaluk et al. | 117/106 |
| 5,378,651 | 1/1995 | Agnello et al. | 438/489 |
| 5,853,804 | 12/1998 | Hansen | 427/248.3 |

FOREIGN PATENT DOCUMENTS 0897 192 A1   2/1999  (EP).
WO 97/28560 * 8/1997  (WO).

OTHER PUBLICATIONS

Chapter 5 (pp. 258–367) of the book *VLSI Fabrication Principles Silicon and Gallium Arsenide Second Edition* by author Sorab K. Ghandhi, 1994.
Chapter 5 ( pp. 124–160) of the book *Sllicon Processing for the VLSI Era vol. 1—Process Technology* by S. Wolf and R.N. Tauber, 1986.

\* cited by examiner

Primary Examiner—Benjamin L. Utech
Assistant Examiner—Donald L. Champagne
(74) Attorney, Agent, or Firm—Kolisch Hartwell Dickinson McCormack & Heuser

(57) ABSTRACT

A method of growing epitaxial semiconductor layers with reduced crystallographic defects. The method includes growing a first epitaxial semiconductor layer on a semiconductor substrate under conditions of relatively high temperature and low source gas flow to heal defects in or on the surface of the substrate. Subsequently, a second epitaxial semiconductor layer is grown on the first layer under conditions of relatively low temperature and high source gas flow. The first epi layer acts as a low-defect seed layer by preventing defects in the surface of the substrate from propagating into the second epi layer. Optionally, a hydrogen chloride etch may be employed during a portion of the first epi layer growth to increase the efficacy of the first layer.

10 Claims, 3 Drawing Sheets

$X_0 - X_1$: Ramp Temperature of Wafer from $T_0$ to $T_1$
$X_2$: Flow Etchant Gas
$X_3$: Stop Flow of Etchant Gas
     Begin First Flow of Source Gas
     Begin Adjusting Temperature of Wafer from $T_1$ to $T_2$
$X_4$: Stop First Flow of Source Gas
$X_5$: Temperature of Wafer Reaches $T_2$
$X_6$: Begin Second Flow of Source Gas
$X_7$: Stop Second Flow of Source Gas Temp = $T_1$ Temp = $T_2 < T_1$

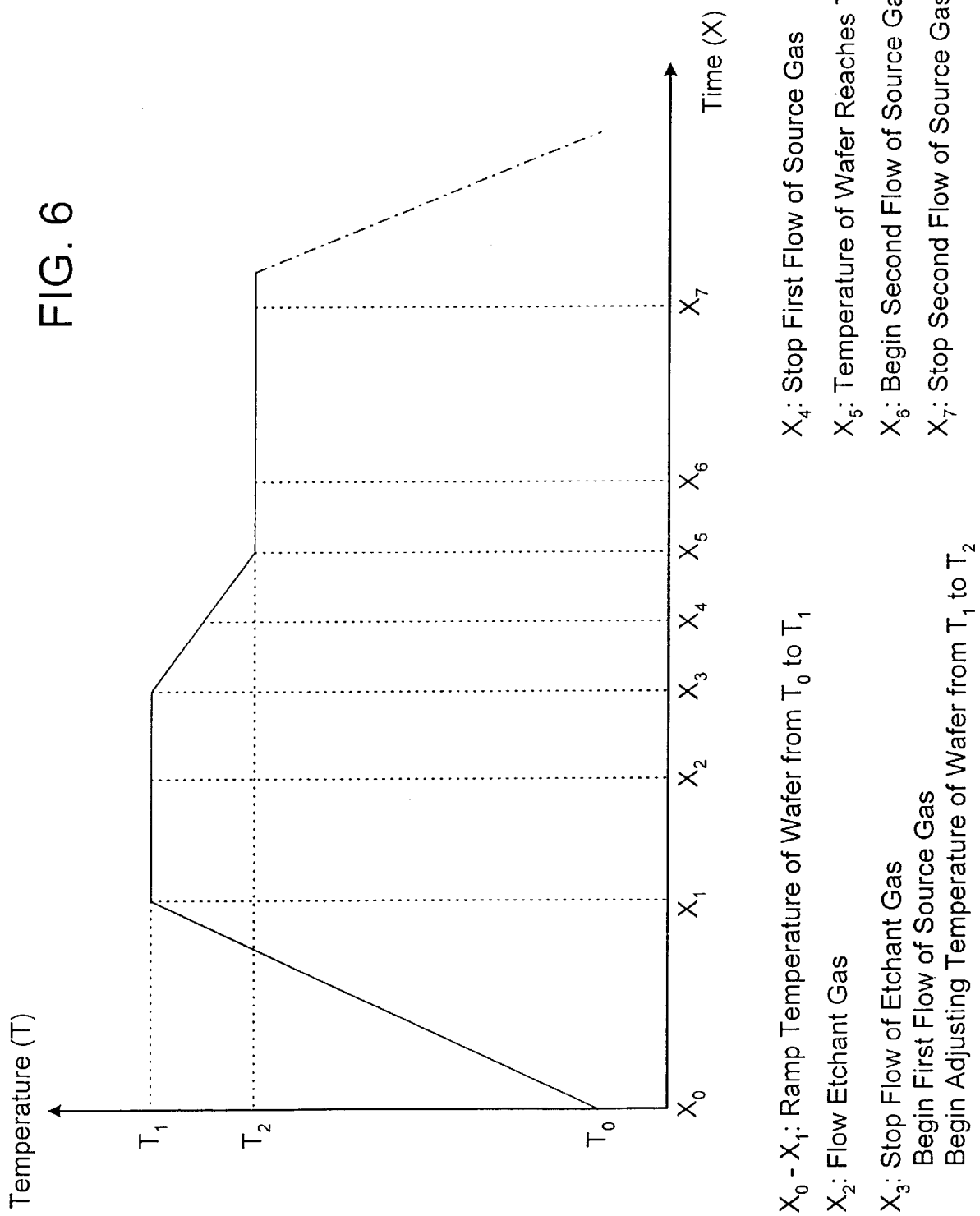

GROWTH OF EPITAXIAL SEMICONDUCTOR MATERIAL WITH IMPROVED CRYSTALLOGRAPHIC PROPERTIES

TECHNICAL FIELD

The present invention relates to growth of epitaxial semiconductor layers, and more particularly to a process for growing an epitaxial semiconductor layer on a semiconductor substrate to reduce the number of crystallographic defects which propagate into the epitaxial layer from the substrate.

BACKGROUND OF THE INVENTION

Integrated circuits have revolutionized virtually all areas of human activity. Although the processes for manufacturing integrated circuits are extremely complex and expensive, manufacturers have developed mass production techniques to reduce the costs per integrated circuit (unit cost) to a few dollars for most circuits. As a result, millions of integrated circuits are incorporated into a diverse array of consumer, industrial, and military products each year.

However, the integrated circuit manufacturing industry is one of the most competitive in the world. Even a small increase or decrease in a manufacturer's unit cost can have a dramatic impact on the maiiufacturer's profits or market share. To remain competitive in this market, integrated circuit manufacturers must continuously strive to reduce their unit cost by increasing both yield and throughput.

Yield is a measure of the number of integrated circuits which are free of fatal defects (i.e., defects which prevent the circuit from functioning properly). Integrated circuits are typically manufactured on semiconductor wafers. Depending on the relative sizes of the wafer and integrated circuit, a single wafer may contain from just a few, to hundreds of integrated circuits. Yield is usually expressed as the average percentage of integrated circuits per wafer which are free of fatal defects. Yield may be measured at the end of a particular processing step, or may be measured at the end of the entire manufacturing process. In either case, a higher yield means that manufacturing costs are spread over a larger number of integrated circuits, thus reducing the unit cost.

Throughput is a measure of the number of integrated circuits which are manufactured in a particular time period. Throughput is sometimes expressed as the number of 'wafers per hour' which are cycled through a particular process such as an epitaxial reactor. If the throughput of an epitaxial reactor is increased, then fewer reactors are needed to process a given number of wafers, thus saving capital equipment expenditures and reducing the unit cost.

Unfortunately, yield and throughput can be conflicting goals. Modifications to the manufacturing process that are intended to increase throughput often result in lower yield, and vice versa. As a result, manufacturers typically must make compromises between maximum yield and maximum throughput to minimize their unit cost. One integrated circuit manufacturing process in which this yield versus throughput conflict arises is epitaxy.

Epitaxy generally involves the growth or deposition of a single-crystal layer of semiconductor material on the surface of a semiconductor substrate of the same material such that the epitaxial layer has the same crystal orientation as the underlying substrate. Many modern integrated circuits are foamed in epitaxial semiconductor layers on a semiconductor substrate rather than in the substrate itself. Therefore, growth of high quality epitaxial layers (epi layers) at low cost is an important goal for many integrated circuit manufacturers.

Two important characteristics which determine the quality of an epi layer, and thus the yield of the manufacturing process, are the number of crystallographic defects and the transition width. Crystallographic defects are non-uniformities in the crystal structure of the epi layer. Many of these crystallographic defects are caused by defects or impurities in the substrate surface which then propagate into the epi layer during epitaxial growth. Stacking faults are a common example of such crystallographic defects which can cause operating failures in circuits formed in the epi layer. Thus, a reduction in these defects may increase yield.

The transition width describes the thickness of the region of the epi layer adjacent the substrate where the dopant concentration is higher or lower than in the remainder of the epi layer due to diffusion of dopants into and/or out of the substrate. If the transition width extends into the area of the epi layer in which circuits are formed, the circuits may not function properly. Thus, a reduction in transition width may increase yield.

One of the most effective ways to reduce the cost of an epitaxy process step is to increase the throughput of the epitaxial reactor by increasing the growth rate of the epi layer. A higher growth rate means reducing the time needed to grow an epi layer of a particular thickness, which allows more wafers to be processed in a given time period.

However, increased growth rates typically lead to increased defects in the epi layer. Further, one of the primary techniques for increasing the growth rate—raising the temperature of the substrate during growth—causes increased dopant diffusion, thereby increasing the transition width. As a result, manufacturers often must compromise between high throughput and high yield to minimize their unit costs.

Therefore, it would be desirable to have a process for growing an epitaxial semiconductor layer at a high growth rate to maximize throughput, while also maximizing yield by reducing the number of crystallographic defects and the transition width. Such a process could significantly reduce a manufacturer's unit cost.

SUMMARY OF THE INVENTION

The invention provides a method of growing epitaxial semiconductor layers with reduced crystallographic defects while maintaining throughput and minimum transition width. The method includes growing a first epitaxial semiconductor layer on a semiconductor substrate under conditions of relatively high temperature and low source gas flow to cover or occlude defects in the surface of the substrate. Subsequently, a second epitaxial semiconductor layer is grown on the first layer under conditions of relatively low temperature and high source gas flow. The second epi layer is configured to have the thickness and dopant concentration required for a particular integrated circuit manufacturing process. The first epi layer acts as a low-defect seed layer by occluding at least some of the defects in the surface of the substrate and preventing those defects from propagating into the second epi layer. Optionally, the substrate may undergo a hydrogen chloride etch during at least a portion of the first epi layer growth to increase the occluding effect of the first epi layer.

BRIEF DESCRIPTION OF THE DRAWINGS

FIG. 6 is a graph of the process steps for operating an epitaxial reactor corresponding to the method of FIG. 5.

DETAILED DESCRIPTION AND BEST MODE FOR CARRYING OUT THE INVENTION

Figure 1:
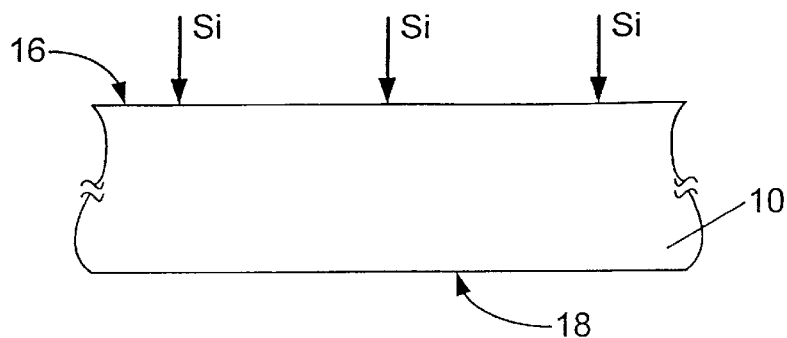
FIG. 1 is a fragmentary, cross-sectional view of a silicon wafer during growth of a first epitaxial layer of silicon according to the present invention.
Figure 2:
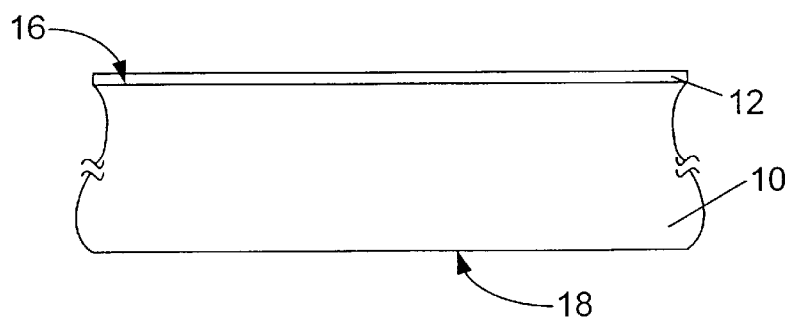
FIG. 2 is a fragmentary, cross-sectional view of the silicon wafer of FIG. 1 showing the first epitaxial layer of silicon on the surface of the substrate.
Figure 3:
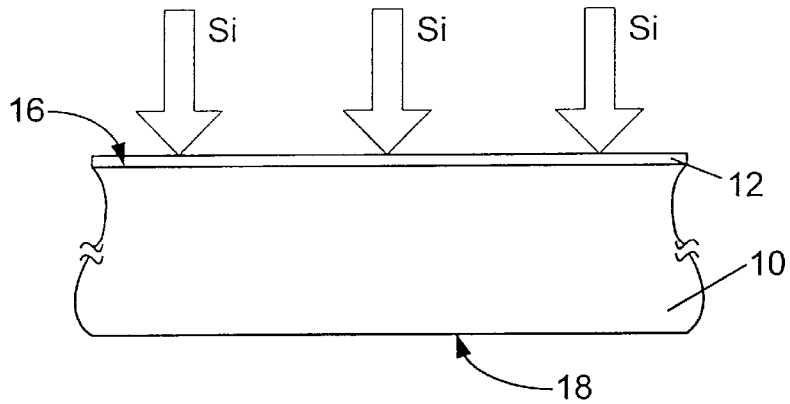
FIG. 3 is a fragmentary, cross-sectional view of the silicon wafer of FIG. 2 during growth of a second epitaxial layer of silicon according to the present invention.
Figure 4:
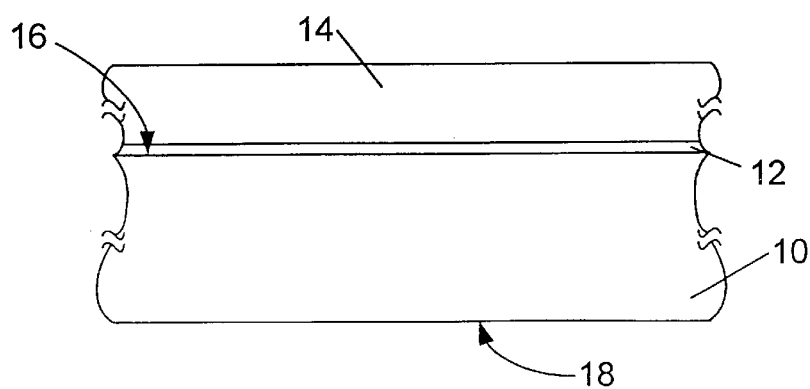
FIG. 4 is a fragmentary, cross-sectional view of the silicon wafer of FIG. 3 showing the second epitaxial layer of silicon on the first epitaxial layer.

FIGS. 1–4 illustrate a semiconductor substrate 10 undergoing a process for growing epitaxial semiconductor material with improved crystallographic properties according to the present invention. In one process step, a first epitaxial layer of semiconductor material 12 (also referred to herein as a 'seed layer') is grown on a surface of substrate 10 to cover crystallographic defects in the surface. In a subsequent process step, a second epitaxial layer of semiconductor material 14 is grown on the first epitaxial layer. The first epitaxial layer prevents at least some of the crystallographic defects in the surface from propagating into the second epitaxial layer.

Substrate 10 is depicted in FIGS. 1–4 as a silicon wafer undergoing growth of silicon epitaxial layers. However, those of skill in the art will appreciate that there are other semiconductor substrates and materials which are suitable for processing in accordance with the present invention. Therefore, while the description below refers to substrate 10 as a silicon wafer and to epi layers 12 and 14 as silicon epi layers, it will be understood that other semiconductor substrates and materials are also included.

Silicon wafer 10 is usually a single crystal structure with a front surface 16 aligned substantially along the primary crystal plane. Front surface 16 is typically highly polished to form a relatively planar surface. Back surface 18, which is substantially parallel to front surface 16, may also be polished, or may be comparatively rough or irregular. Wafer 10 is generally in the shape of a circular disk having a diameter and thickness which conform to prescribed standards within the integrated circuit manufacturing industry. For example, many manufacturers currently use silicon wafers having a diameter of approximately 200 mm and a thickness of approximately 0.725 mm. However, it will be appreciated that wafer 10 may have a different diameter or thickness, or may be in a form other than a circular disk.

Wafer 10 typically has some relatively significant concentration of dopant atoms within the crystal lattice to impart a desired resistivity to the wafer. The dopant species may be an acceptor, such as boron, or a donor such as phosphorus, arsenic, or antimony. In any event, wafer 10 acts as a single-crystal base on which single-crystal epi layers can be grown. As discussed in more detail below, these epi layers may have the same dopant concentrations and species as wafer 10, or they may have different dopant concentrations and/or dopant species.

Although front surface 16 is typically highly polished and cleaned to remove most defects and impurities, it is virtually impossible to provide a perfect single-crystal surface of silicon on which to grow an epitaxial layer. Thus, for example, front surface 16 will usually include a variety of imperfections such as scratches, oxygen precipitates, and agglomerations of native point defects, as well as contaminants including metals, organic materials, etc. These surface imperfections are hereinafter referred to collectively as crystallographic defects, or defects, in front surface 16 of wafer 10. In addition, it will be appreciated that similar defects will ordinarily be present on back surface 18. Indeed, in the embodiment in which back surface 18 is unpolished, many more defects will typically be present than in front surface 16.

Figure 5:
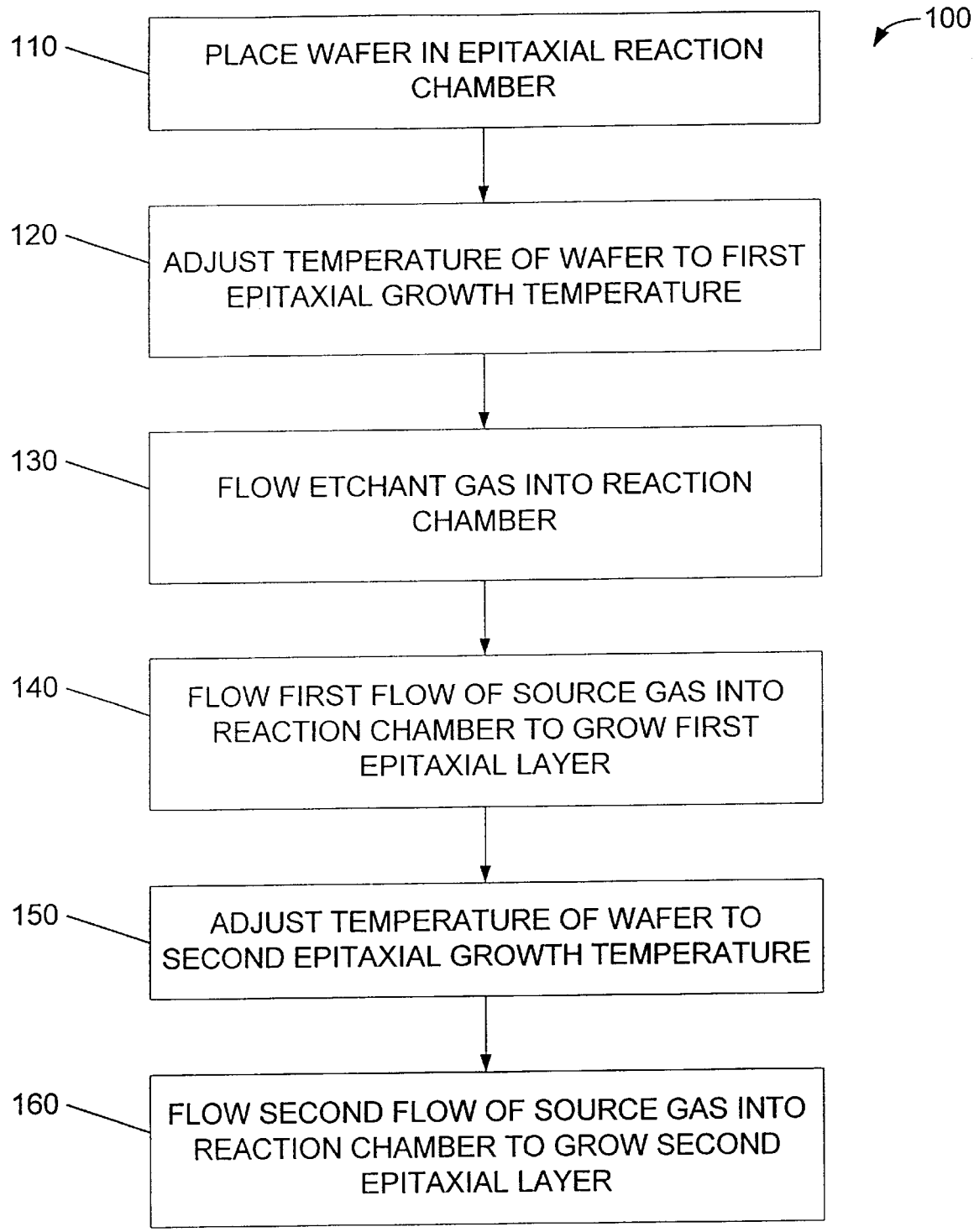
FIG. 5 is a flowchart illustrating a method of growing epitaxial semiconductor material with improved crystallographic properties according to the present invention.

Epi layers 12 and 14 may be formed using any of several standard epitaxy processes. A method for forming epi layers 12 and 14 in accordance with the present invention by a process known as vapor phase epitaxy is indicated generally at 100 in FIG. 5. Vapor phase epitaxy may be conducted at atmospheric pressure or at a pressure above or below atmospheric pressure. The method involves, at step 110, placing one or more semiconductor substrates having front surfaces, such as silicon wafer 10, in an epitaxial reaction chamber configured for growing epitaxial semiconductor layers on semiconductor substrates.

Subsequently, at step 120, the temperature of wafer 10 is adjusted to a first temperature suitable for epitaxial silicon growth. Typically, the first temperature is in the range of 1000 to 1200 degrees Celsius. In one embodiment, the first temperature is 1130 degrees Celsius. However, those of skill in the art will appreciate that the first temperature will vary depending on a variety of factors including the pressure within the reaction chamber and the reactant Source gas used. FIG. 6 is a temperature versus time graph corresponding to the method of FIG. 5, and illustrating a sequence of steps carried out in an epitaxial reaction chamber according to the present invention. As depicted in FIG. 6, the temperature of wafer 10 is usually changed gradually, or 'ramped,' from a nominal temperature $T_0$ at a time $X_0$, to the first temperature $T_1$ at a time $X_1$.

At step 130, an etchant species such as hydrogen chloride (HCl) is flowed into the reaction chamber to etch silicon from the front surface of wafer 10, as indicated at time $X_2$ in FIG. 6. The hydrogen chloride etch step acts to remove at least some of the defects which usually exist in front surface 16. Optionally, hydrogen is flowed into the reaction chamber prior to time $X_2$. At elevated temperatures, hydrogen acts to clean wafer 10 by removing impurities such as silicon dioxide from front surface 16. In any event, at time $X_3$ when step 130 is completed and the flow of hydrogen chloride is turned off, front surface 16 has been rendered relatively defect-free.

Nevertheless, it is virtually impossible to provide an absolutely defect-free surface, thus there will typically be a plurality of defects in front surface 16 immediately prior to epi layer growth. Because epitaxial growth occurs by individual silicon atoms attaching to, and replicating, the underlying crystal structure, defects in the crystal structure of front surface 16 may be replicated in, and propagate through, an epi layer grown on the front surface.

However, it has been observed that epitaxial growth on front surface 16 at a relatively high growth temperature and a relatively low growth rate acts to occlude at least some of the defects and prevent those defects from propagating through the epi layer. Unfortunately, the growth rate to best achieve this occlusion effect is impractical for many mass production processes. The low growth rate causes a corresponding decrease in the throughput of the epitaxial reactor because a longer growth time is needed to obtain a desired epi layer thickness. In addition, the longer growth time, as well as increased growth temperature, cause increased dopant diffusion into, or out of, the wafer, thereby increasing the transition width.

To obtain the defect occlusion effect of the high temperature, low growth rate process without sacrificing throughput or increasing transition width, the invention employs a two-step epi growth process. At the completion of the hydrogen chloride etch, first epi layer 12 is grown on front surface 16 under the high temperature, low growth rate conditions necessary to occlude defects in the front surface. Then second epi layer 14 is grown on first layer 12 under relatively low temperature, high growth rate conditions to achieve the desired epi layer thickness while maintaining throughput and yield.

Thus, at step 140, a first flow of source gas is flowed into the reaction chamber to grow a first epitaxial silicon layer on front surface 16 to cover defects in the front surface. The source gas may be any of several suitable semiconductor source gases which are well known to those of skill in the art. Common silicon source gases include silane, dichlorosilane, and trichlorosilane. In addition, the source gas is commonly diluted by flowing hydrogen into the reaction chamber simultaneously with the source gas. Further, a small flow of a suitable dopant gas may be flowed into the reaction chamber to provide a desired dopant concentration in the first epi layer.

The flow rate of the source ,as is controlled at a relatively low rate so that epitaxial growth is mass transfer rate limited (i.e., the growth rate is controlled by the flux of silicon reactants reaching the surface of the substrate, rather than by the rate at which those reactants react to deposit silicon on the crystal lattice). It will be understood that the exact flow of source gas during growth of first epi layer 12 will vary depending on such factors as the growth temperature, the size and configuration of the chamber, and the partial pressure of any diluent gas and/or dopant gas.

In the embodiment depicted in FIG. 6, the first flow of source gas begins at time $X_3$, which coincides with the completion of step 130. In one embodiment, the first flow of source gas is gradually ramped up from zero rather than surging the source gas to the desired flow rate. The first flow of source gas continues until time $X_4$, which is selected to give the desired thickness of first epi layer 12. In one embodiment, first epi layer 12 is approximately 0.4 $\mu$m (microns) or less.

It will be appreciated that by starting the first flow of source gas at substantially the same time that the flow of hydrogen chloride gas is ended, there will be an intermediate period just after time $X_3$ during which both hydrogen chloride and the source gas will be present in the reaction chamber. During this intermediate period, before the residue of hydrogen chloride is exhausted from the chamber, both silicon etching and silicon epitaxial growth will occur simultaneously. It has been observed that this simultaneous etching and epitaxial growth further reduces the number of defects which propagate through second epi layer 14. Alternatively, the first flow of source gas may be started before the flow of hydrogen chloride is ended. As a further alternative, there may be a delay between ending the flow of hydrogen chloride and starting the first flow of source gas so that etching and epitaxial growth do not occur simultaneously. As another alternative, the hydrogen chloride etching step may be omitted altogether.

Subsequently at step 150, the temperature of wafer 10 is adjusted to a second growth temperature $T_2$ suitable for growing second epi layer 14. The second growth temperature is lower than the first growth temperature and is selected to provide an acceptable growth rate without causing excessive dopant diffusion into, or out of, the wafer. In one embodiment, the second growth temperature is 1100 degrees Celsius. Alternatively, other temperatures may be used as required by the particular application.

The temperature of wafer 10 is typically adjusted gradually from the first temperature to the second temperature. In the embodiment depicted in FIG. 6, the temperature of wafer 10 is ramped from $T_1$ at time $X_3$ to $T_2$ at time $X_5$. Thus, the step of adjusting the temperature of the wafer is begun at substantially the same time as the step of flowing the first source gas to grow first epi layer 12. This has the advantage of maximizing throughput by combining the steps of growing the first epi layer and adjusting the temperature of the wafer. In this embodiment, the growth temperature of first epi layer 12 is actually a range of temperatures rather than a single temperature. As a result, the growth rate of the first epi layer may vary throughout step 130. However, in the embodiment in which the first flow of source gas is ramped up from zero, the decrease in growth rate associated with decreasing temperature will at least partially be offset by an increase in growth rate associated with increasing flow.

Alternatively, the step of adjusting the temperature of the wafer may be begun during the step of flowing the first source gas. As a further alternative, the step of adjusting the temperature of wafer 10 may be delayed until after the step of flowing the first source gas has been completed. In any event, first epi layer 12 is configured to act as a seed layer for second epi layer 14 by providing a crystal structure on which the second epi layer can form that contains fewer defects than front surface 16.

In the depicted embodiment, the first flow of source gas is ended at time $X_4$, prior to the time $X_5$ when the temperature of wafer 10 reaches the second temperature. As discussed in more detail below, second epi layer 14 is grown by flowing source gas into the reaction chamber from tine $X_6$ to time $X_7$. Thus, during the period between time $X_4$ and time $X_6$ epitaxial growth is prevented due to a lack of source gas in the reaction chambers This sequence has been found to produce dopant concentration profiles across the transition region which are superior, for most applications, to those produced by continuous epitaxial growth from time $X_3$ to time $X_7$. Indeed, where the thickness of first epi layer 12 is substantially less than the thickness of second epi layer 14, the first epi layer may be completely contained within the transition region between wafer 10 and the second epi layer. In that case, there is no need to match the dopant concentration of the first epi layer with the dopant concentration of the second epi layer because diffusion is still the dominant doping characteristic in this region. Alternatively, continuous epitaxial growth of both the first epi layer and the second epi layer may be achieved by growing the first epi layer as described above, and then ram-aping the temperature of the wafer from the first temperature to the second temperature and ramping the flow rate of the source gas from the first flow to the second flow, to grow the second epi layer.

Once the temperature of wafer 10 has been adjusted to the second growth temperature, a second flow of source gas is flowed into the epitaxial reaction chamber to grow second epi layer 14. The second epi layer is typically the layer in which integrated circuits will be formed. Therefore, control variables such as the second growth temperature, the flow rate of the source gas, and the flow rate of any dopant species will be selected to produce an epi layer having the thickness and resistivity required by the particular integrated circuit manufacturing process.

The dopant concentration of the second epi layer is typically different than that of the wafer to provide desired electrical characteristic necessary for integrated circuit manufacturing. As discussed above, the dopant concentration of the first epi layer may be the same as, or different than, the dopant concentration of the second epi layer. In any event, the second epi layer will be thicker than the first epi layer to provide the epitaxial thickness necessary to receive integrated circuits. Most applications currently require a second layer epi thickness of approximately 2 µm or larger. Indeed, some high power applications require a second epi layer thickness of 100 µm or more. However, those of skill in the art will appreciate that as the sizes of integrated circuits continue to shrink the thickness required for second epi layer 14 will also shrink.

As illustrated in FIG. 6, the second flow of source gas is begun at time $X_6$ when the temperature of wafer 10 is stable at $T_2$, and continues until the desired epi layer thickness is achieved at time $X_7$. Although the growth temperature of the second epi layer is lower than that of the first epi layer, the growth rate of the second epi layer is significantly higher than that of the first epi layer because the second flow of source gas is significantly higher than the first flow of source gas. In one embodiment, the first flow of source gas is approximately 10 percent of the second flow of source gas.

Once second epi layer 14 has been grown, the temperature of wafer 10 is usually ramped down to a nominal temperature before the wafer is removed from the epitaxial chamber for further processing. Alternatively, wafer 10 may undergo additional processing in the epitaxial reaction chamber.

While the invention has been described above in the context of growing epitaxial layers on the front surface of a wafer, it will be appreciated that the invention is also applicable to growing epitaxial layers on the back surface. Thus, epitaxial layers may be grown on either the front surface or the back surface, or alternatively, epitaxial layers may be grown on both the front and back surfaces as required by the particular application.

Industrial Applicability

This invention is applicable to semiconductor substrates for electronic integrated circuits, and is particularly applicable to semiconductor substrates used in integrated circuit manufacturing processes which require low-defect epitaxial layers.

While the invention has been disclosed in its preferred form, the specific embodiments thereof as disclosed and illustrated herein are not to be considered in a limiting sense as numerous variations are possible. Applicants regard the subject matter of the invention to include all novel and non-obvious combinations and subcombinations of the various elements, features, functions and/or properties disclosed herein. No single feature, function, element or property of the disclosed embodiments is essential. The following claims define certain combinations and subcombinations which are regarded as novel and non-obvious. Other combinations and subcombinations of features, functions, elements and/or properties may be claimed through amendment of the present claims or presentation of new claims in this or a related application. Such claims, whether they are broader, narrower or equal in scope to the original claims, are also regarded as included within the subject matter of applicants' invention.

We claim:

1. A method of forming an epitaxial semiconductor layer on a semiconductor substrate, the method comprising.

placing a silicon substrate having a front surface within an epitaxial reaction chamber;

adjusting the temperature of the substrate to a first temperature suitable for epitaxial silicon growth;

flowing a first flow of source gas into the reaction chamber at a first flow rate to grow a first epitaxial silicon layer on the front surface of the substrate to cover crystallographic defects in the front surface;

adjusting the temperature of the substrate to a second temperature suitable for epitaxial silicon growth, where the second temperature is lower than the first temperature; and flowing a second flow of source gas into the reaction chamber at a second flow rate when the substrate is at the second temperature to grow a second epitaxial silicon layer on the first layer, where the second flow rate is higher than the first flow rate;

where the first and second layers each have a thickness, and the second layer is thicker than the first layer.

2. The method of claim 1, further comprising the steps of controlling the first flow of source gas and the second flow of source gas into the reaction chamber so that the first layer is grown more slowly than the second layer.

3. The method of claim 1, wherein the flow rate of the first flow of source gas is approximately 10 percent or less than the flow rate of the second flow of source gas.

4. The method of claim 1, wherein the step of adjusting the temperature of the substrate to the second temperature is begun during the step of flowing the first flow of source gas into the reaction chamber.

5. The method of claim 4, wherein the step of flowing the first flow of source gas into the reaction chamber is completed before the substrate reaches the second temperature.

6. The method of claim 1, wherein the step of adjusting the temperature of the substrate to the second temperature is begun at substantially the same time as the step of flowing the first flow of source gas into the reaction chamber.

7. The method of claim 1, further comprising the step of flowing an etchant gas into the reaction chamber when the substrate is at the first temperature.

8. The method of claim 7, wherein the step of flowing the first flow of source gas into the reaction chamber is begun while the etchant gas is flowing into the reaction chamber.

9. The method of claim 7, wherein the step of flowing the first flow of source gas into the reaction chamber is begun at substantially the same time that the step of flowing the etchant gas is completed.

10. The method of claim 9, wherein the step of adjusting the temperature of the substrate to the second temperature is begun at substantially the same time as the step of flowing the first flow of source gas into the reaction chamber.

* * * * *